United States Patent [19]

Jordan et al.

[11] Patent Number: 4,961,125
[45] Date of Patent: Oct. 2, 1990

[54] APPARATUS AND METHOD OF ATTACHING AN ELECTRONIC DEVICE PACKAGE AND A HEAT SINK TO A CIRCUIT BOARD

[75] Inventors: William D. Jordan, Dallas; Donald L. Clemens, The Colony, both of Tex.

[73] Assignee: Thermalloy Incorporated, Dallas, Tex.

[21] Appl. No.: 395,661

[22] Filed: Aug. 18, 1989

[51] Int. Cl.⁵ .............................................. H05K 7/20
[52] U.S. Cl. ..................................... 361/383; 361/388; 165/80.3; 174/16.3
[58] Field of Search ............... 361/383, 384, 388, 389; 165/80.3; 174/16.3; 357/81

[56] References Cited

U.S. PATENT DOCUMENTS

| | | | |
|---|---|---|---|
| 3,465,212 | 9/1969 | Grimes et al. | 165/80.3 |
| 3,572,428 | 3/1971 | Monaco | 361/383 |
| 4,215,361 | 7/1980 | McCarthy | 165/80.3 |
| 4,552,206 | 11/1985 | Johnson et al. | 165/80.3 |
| 4,575,038 | 3/1986 | Moore | 361/383 |
| 4,609,040 | 9/1986 | Moore | 165/80.3 |
| 4,720,771 | 1/1988 | Horton | 361/388 |
| 4,729,426 | 3/1988 | Hinshaw | 165/803 |
| 4,755,146 | 7/1988 | Rishworth et al. | 361/383 |

Primary Examiner—Roy N. Envall, Jr.
Attorney, Agent, or Firm—Richards, Medlock & Andrews

[57] ABSTRACT

Disclosed are apparatus and methods for attaching an electronic device package and a heat sink to a circuit board or the like. The electronic device package has a body with a planar bottom and leads extending from the body. The distal ends of the leads are coplanar with the bottom of the electronic device package. The heat sink has a base, heat-dissipating fins or the like and a clip for securing the electronic device package to the heat sink. A pair of dimples project downward from the base of the heat sink to tilt the bottom of the electronic device package. Tilting the electronic device package causes the ends of the leads to contact the circuit board so that the leads can be easily soldered to the circuit board. The dimples and the front edge of the heat sink can also be soldered to the circuit board.

14 Claims, 1 Drawing Sheet

APPARATUS AND METHOD OF ATTACHING AN ELECTRONIC DEVICE PACKAGE AND A HEAT SINK TO A CIRCUIT BOARD

This invention relates to electronic components and methods of attaching such components to circuit boards and the like. More particularly, it relates to combinations of circuit boards, electronic device packages and heat sinks.

Electronic devices generate heat which must not be allowed to exceed a certain level or the performance of the electronic device may be adversely affected. If the heat becomes very excessive, the electronic device may be damaged.

Heat generated by an electronic device may be dissipated by attaching a heat sink to the electronic device package. Often heat sinks are attached between the electronic device package and the circuit board on which it is mounted.

U.S. Pat. No. 4,729,426 issued Mar. 8, 1988 to Hinshaw discloses apparatus which includes a circuit board, an electronic device package and a heat sink. The heat sink has a planar base for attachment between the electronic device package and the circuit board. The heat sink also has radiating fins for dissipating thermal energy. A clip attached to the base secures the electronic device package to the heat sink.

U.S. Pat. No. 4,609,040 issued Sept. 2, 1986 to Moore discloses the combination of a circuit board, an electronic device package and a heat sink. The heat sink has a clip which may have a pair of spaced embossments. The spaced embossments wrap around the reverse bent portion of the clip to increase the rigidity and resiliency of the clip.

Heat sinks generally must be designed for use with a specific electronic device package. For example, a DPAK (an electronic device package developed by Motorola, Inc.) could not be used with the heat sink disclosed in the Moore patent. A DPAK has a body with a planar bottom and leads extending from the body which are bent so that the distal ends of the leads are coplanar with the bottom of the body. A heat sink like the one shown in the Moore patent would hold the distal ends of the DPAK leads off the circuit board. In order to mount a DPAK, the heat sink must not only have sufficient contact with the heat dissipating surface of the DPAK but must mount the DPAK so that the distal ends of the leads touch the circuit board.

The apparatus and method of the invention involve a circuit board, an electronic device package such a DPAK and a heat sink. The heat sink has a planar base for attachment to the electronic device package as well as the usual heat-radiating fins. The heat sink also has a pair of support projections extending from the base to tilt the bottom of the electronic device package at an angle to the planar surface of the circuit board so that the distal ends of the leads can be attached to the circuit board. Other features and advantages of the invention will become more readily understood from the following detailed description taken in connection with the appended claims and attached drawing in which:

Figure 1:
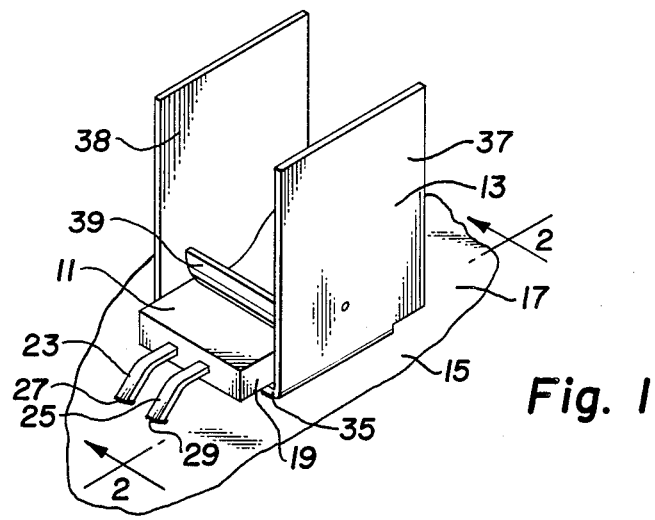
FIG. 1 is a perspective view of the preferred embodiment of invention.
Figure 2:
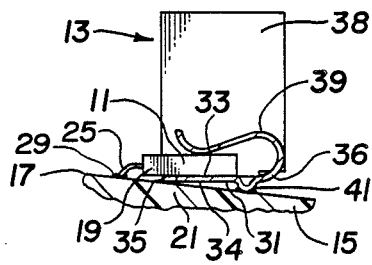
FIG. 2 is a sectional view of the combination shown in FIG. 1.

FIGS. 1 and 2 illustrate the preferred embodiment of the invention. The apparatus includes an electronic device package 11 and a heat sink 13 attached to a circuit board 15. The circuit board 15 has a planar surface 17 upon which the electronic device package 11 and the heat sink 13 are mounted.

The electronic device package 11 has a body 19 with a planar bottom surface 21. Leads 23 and 25 extending from one end of the body 19 of the electronic device package 11 are bent so that the distal ends 27 and 29 of the leads 23 and 25 are coplanar with the bottom surface 21 of the body 19. If the electronic device package 11 is mounted on the circuit board 15 without the heat sink 13, the distal ends 27 and 29 of the leads 23 and 25 will touch the surface 17 of the circuit board 15 so that the leads 23 and 25 can be easily soldered to the circuit board 15.

One electronic device package 11 having the described configuration is the DPAK package. A DPAK may house any of a large number of electronic devices. Such devices may include bipolar power transistors, thyristors, rectifiers, zener diodes and transient suppressors. Heat generated by the electronic device in the package 11 is normally dissipated through the bottom 21 of the electronic device package 11. However, in some cases it is desirable to add a heat sink to facilitate dissipation of heat from the electronic device package 11.

The heat sink 13 has a base 31 for attachment to the bottom 21 of the electronic device package 11. The base 31 is thus located between the bottom surface 21 of the electronic device package 11 and the top surface 17 of the circuit board 15. The base 31 has a first major face 33 which is in thermal contact with the bottom surface 21 of the electronic device package 11 and a second major face 34 oppositely disposed from the first major face 33. The base 31 also has first and second oppositely disposed ends 35 and 36.

The heat sink 13 is preferably constructed of aluminum or an aluminum alloy which has a relatively high heat transfer coefficient. The base 31 of the heat sink 13 thus conducts heat away from the bottom 21 of the electronic device package 11. The base 31 is connected to fins 37 and 38 or the like which extend upward and/or outward from the base 31 to radiate heat into the surrounding environment. The fins 37 and 38 may take any desired shape suitable for dispersion of thermal energy by radiation, convection or conduction, depending on the operational environment.

The electronic device package 11 is secured to the heat sink 15 by a clip 39 which is integrally connected to the base 31 of the heat sink 15. The clip 39 is resilient and is bent over the base 31 to receive the electronic device package 11. The force of the clip 39 holds surface 33 of the base 31 and surface 21 of the electronic device package 11 together to maintain a thermal connection. The leads 23 and 25 extend past the first end 35 of the base 31.

Figure 3:
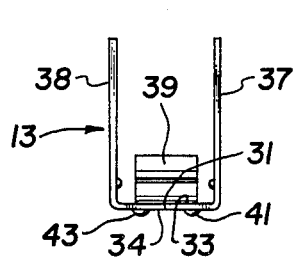
FIG. 3 is a front view of the heat sink shown in FIG. 2.
Figure 4:
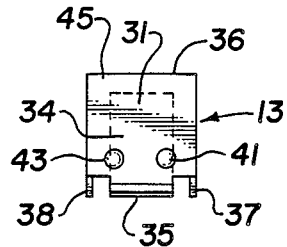
FIG. 4 is a bottom plan view of the heat sink shown in FIG. 2.

As shown in FIGS. 2-4, a pair of dimples 41 and 43 project downward from the second major face 34 of the base 31 of the heat sink 13 at a location disposed toward the second end 36 of the base 31. The dimples extending from the second major face 34 of the base terminate in the plane defined by the ends of leads 23 and 25 and the edge of the base 31 defined by the first end 35 and the bottom surface 34. Without dimples 41 and 43 or similar support means, the base 31 of the heat sink 13 would hold the distal ends 27 and 29 of the leads 23 and 25 off the surface 17 of the circuit board 15. However, the projection of the dimples 41 and 43 tilts the bottom surface 34 of the electronic device package 11 at an acute angle to the planar surface 17 of the circuit board 15. This tilt causes the ends 27 and 29 of the leads 23 and 25 to touch the circuit board 15 so that the leads 23 and 25 and can be easily soldered or otherwise attached to the circuit board 15 when the dimples and front edge touch the circuit board.

The heat sink 13 often must also be soldered or otherwise attached to the circuit board 15 to provide mechanical stability and/or electrical connection to circuitry on the board. The front edge of first end 35 of the base 31 and the two dimples 41 and 43 provide three points of contact between the heat sink 13 and the circuit board 15. These three contact points can be easily soldered or otherwise attached to the circuit board 15 to provide adequate mechanical support and electrical connection.

It will be appreciated that the foregoing detailed description is presented by way of example only. Various modifications and changes may be made thereto without departing from the spirit and scope of the invention as defined by the appended claims.

What is claimed:

1. The combination comprising:
   (a) a circuit board having a planar surface;
   (b) a heat sink comprising:
      (i) a base having first and second oppositely disposed major faces and first and second
      (ii) heat-dissipating means extending from said base; and
      (iii) support means extending from said second major face at a location disposed toward said second end and secured to said planar surface of said circuit board to support said second major face at an acute angle with respect to said planar surface of said circuit board; and
   (c) an electronic device package having a planar surface secured adjacent said first major face with leads extending from one end thereof, the distal ends of said leads aligned coplanar with said planar surface of said device package, said leads extending from said first end of said base and secured to said planar surface of said circuit board.

2. The combination set forth in claim 1 wherein said heat-dissipating means is a heat-radiating fin.

3. The combination set forth in claim 1 wherein said support means is a projection extending from said second major face.

4. The combination set forth in claim 3 wherein said projection is a pair of dimples.

5. The combination set forth in claim 1 wherein said support means, said first end of said base and said leads are secured to said planar surface of said circuit board.

6. A heat sink for attaching an electronic device package having a planar surface and leads extending from one end thereof, the distal ends of the leads aligned coplanar with the planar surface of the device package, to a circuit board having a planar surface, said heat sink comprising:
   (a) a base having first and second oppositely disposed major faces and first and second oppositely disposed ends;
   (b) heat-dissipating means extending from said base; and
   (c) support means extending from said second major face at a location disposed toward said second end adapted to be secured to the surface of a circuit board to support said second major face at an acute angle with respect to the surface of the circuit board.

7. A heat sink as defined in claim 6 wherein said heat-dissipating means is a heat-radiating fin.

8. A heat sink as defined in claim 6 wherein said support means is a projection extending from said second major face.

9. A heat sink as defined in claim 8 wherein said projection is a pair of dimples.

10. A heat sink as defined in claim 6 wherein said support means, said first end of said base and said leads are adapted to be secured to the surface of the circuit board and are aligned coplanar with the distal ends of the leads of the electronic device package.

11. The method of attaching an electronic device package and a heat sink to a circuit board wherein the electronic device package includes a body with a planar bottom and leads extending from the body with their distal ends aligned coplanar with the bottom of the body, said method comprising the steps of:
    (a) attaching the electronic device package to a heat sink having a base for attachment to the bottom of the electronic device package between the electronic device package and the circuit board, heat dissipating means attached to the base, means attached to the base for securing the bottom of the electronic device package in thermal contact with the base, and support means extending from the base to tilt the bottom of the electronic device package at an angle to the planar surface of the circuit board, so that the distal ends of the leads contact the surface of the circuit board; and
    (b) attaching the support means and the leads to the circuit board.

12. The method defined in claim 11 wherein the step of attaching the electronic device package to the heat sink includes retaining the electronic device package between the base of the heat sink on a clip extending from the base of the heat sink.

13. The method defined in claim 11 further including the step of soldering a portion of the base of the heat sink to the circuit board.

14. The method of mounting a heat sink and an electronic device package having a planar surface and leads extending therefrom which terminate in the plane of said planar surface comprising the steps of:
    (a) mounting the planar surface of the electronic device package adjacent the first major face of a heat sink having first and second oppositely disposed major faces and first and second oppositely disposed ends so that the leads extend past said first end of said heat sink;
    (b) forming support means on the second major face of the heat sink which extend to and terminate in the plane defined by the distal ends of said leads and the edge of the heat sink defined by said first end and said second major face; and
    (c) soldering the distal ends of the leads, said edge and said support means to the surface of a circuit board.

* * * * *

UNITED STATES PATENT AND TRADEMARK OFFICE
CERTIFICATE OF CORRECTION

PATENT NO. : 4,961,125

DATED : October 2, 1990

INVENTOR(S) : William D. Jordan, et al.

It is certified that error appears in the above-identified patent and that said Letters Patent is hereby corrected as shown below:

Column 3, line 32, after "second" insert ---oppositely disposed ends;---

Signed and Sealed this

Twenty-fourth Day of December, 1991

Attest:

HARRY F. MANBECK, JR.

*Attesting Officer*     *Commissioner of Patents and Trademarks*